(12) United States Patent
Kitamura

(10) Patent No.: US 6,704,421 B1
(45) Date of Patent: Mar. 9, 2004

(54) AUTOMATIC MULTICHANNEL EQUALIZATION CONTROL SYSTEM FOR A MULTIMEDIA COMPUTER

(75) Inventor: John S. Kitamura, Toronto (CA)

(73) Assignee: ATI Technologies, Inc., Markham (CA)

( * ) Notice: Subject to any disclaimer, the term of this patent is extended or adjusted under 35 U.S.C. 154(b) by 0 days.

(21) Appl. No.: 08/899,979

(22) Filed: Jul. 24, 1997

(51) Int. Cl.[7] .................................................. H03G 5/00
(52) U.S. Cl. ....................... 381/103; 381/103; 381/104; 381/61
(58) Field of Search ........................ 381/103, 98, 104, 381/61

(56) References Cited

U.S. PATENT DOCUMENTS

| | | | |
|---|---|---|---|
| 4,064,364 A | | 12/1977 | Veale |
| 4,152,649 A | | 5/1979 | Choquet |
| 4,352,190 A | | 9/1982 | Hullwegen |
| 4,405,836 A | * | 9/1983 | Meyerhoff ................... 381/103 |
| 4,769,848 A | | 9/1988 | Eberbach |
| 4,841,573 A | * | 6/1989 | Fujita ........................... 381/27 |
| 4,903,307 A | * | 2/1990 | Ozawa et al. ................ 381/103 |
| 4,910,779 A | | 3/1990 | Cooper et al. |
| 5,167,021 A | * | 11/1992 | Needham ..................... 395/275 |
| 5,283,819 A | | 2/1994 | Glick et al. |
| 5,412,691 A | | 5/1995 | Ginzburg et al. |
| 5,438,623 A | | 8/1995 | Begault |
| 5,450,312 A | * | 9/1995 | Lee et al. ....................... 700/1 |
| 5,566,237 A | * | 10/1996 | Dobbs et al. ................. 381/103 |
| 5,581,621 A | * | 12/1996 | Koyama et al. .............. 381/103 |
| 5,583,560 A | | 12/1996 | Floriin et al. |
| 5,594,509 A | | 1/1997 | Florin et al. |
| 5,602,928 A | | 2/1997 | Eriksson et al. |
| 5,684,879 A | * | 11/1997 | Verdick ........................ 381/300 |
| 5,745,583 A | * | 4/1998 | Koizumi et al. ............... 381/86 |
| 5,881,103 A | * | 3/1999 | Wong et al. ................. 375/229 |
| 5,910,990 A | * | 6/1999 | Jang .............................. 381/1 |
| 5,912,976 A | * | 6/1999 | Klayman et al. .............. 381/18 |
| 6,341,166 B1 | * | 1/2002 | Basel ........................... 381/103 |

* cited by examiner

Primary Examiner—Xu Mei
Assistant Examiner—Brian Pendleton
(74) Attorney, Agent, or Firm—Vedder, Price, Kaufman & Kammholz, P.C.

(57) ABSTRACT

In one embodiment, an automatic multichannel equalization control system uses programmable multichannel templates containing equalization control values for a programmable multichannel audio processor that selectively controls each channel of multichannel audio using the equalization control values. The system also optionally uses an adaptive equalization template interface to facilitate input of user presets that are incorporated in the stored equalization templates for each audio medium. When the audio medium's identification number (ID) is read from the medium header or a particular track, the system selects the appropriate equalization template preset by the user and programs the programmable multichannel audio processor (equalizer) to effect desired audio output.

17 Claims, 7 Drawing Sheets

AUTOMATIC MULTICHANNEL EQUALIZATION CONTROL SYSTEM FOR A MULTIMEDIA COMPUTER

BACKGROUND OF THE INVENTION

The invention relates generally to computer based multichannel audio control systems and more particularly to computer based programmable multichannel audio control equalization systems.

With the addition of increased video and audio applications in multimedia personal computers, a user can use the computer to watch television, watch movies through cable television links and utilize various other video/audio mediums such as CDs, DVD's that may contain music, movies or other video/audio input. However, conventional audio control systems in multimedia computers have limited capabilities. Generally, only volume, bass and treble controls are provided for each of two channels. Conventional multimedia computer audio systems are typically designed for receiving and outputting at most a stereo output or two channel output.

Some high-end home entertainment systems have multichannel audio systems, such as surround sound systems with three or more channels to provide theater sound effects. For example, home stereos with multichannel capability can process the surround channels by adding a delay or reverb. Some stereos have a number of presets to effect different amounts of delay and reverb. These preset delays and reverbs are used to imply a larger listening area. Delay is used to imply that the surround speakers are farther apart, and reverb implies a wider listening space. Also, the surround sound channels are often presented a lower volume level than front channels since movies contain most of the audio information in the front channels and use the surround channels as effect channels. A typical surround sound multichannel system may include six channels. These channels typically consist of a left, right and center front channel, a left and right surround channel and subwoofer channel.

However, multichannel audio discs such as digital theater sound discs (DTS), sometimes use rear speakers without reverb or delay or attenuation. Also, digital versatile discs or digital videodiscs (DVD's), can be recorded in a plurality of different audio formats. For example, a DVD disc may be recorded in a 96 KHz, 44 KHz, 48 KHz, mono, stereo, multichannel, AC-3 format, MPEG-2 format, DTS, SDDS, HDCD, and other formats. Each format may present audio with different characteristics and may require different equalization settings which are not generally accommodated by multimedia computers.

For example, where a DVD playback unit includes a DVD disc recorded in a multichannel format, the conventional multimedia computer having a two channel audio control system will not provide proper audio output. Nor can conventional two channel audio control systems provide variable delay and reverb options that are selectable by the user. Also, conventional computer audio systems do not typically modify equalization parameters based on whether a device is of a different medium such a CD versus DVD, nor do conventional two channel audio control systems typically modify audio equalization control based on the type of audio format recorded on the medium. With the trend toward improved audio/video systems, there exists a need for an audio control system to properly accommodate and control multichannel audio.

Therefore, there exists a need for a computer based automatic equalization controller for use in multichannel audio systems that accommodates varying audio formats. It would be desirable if such a system could be programmable to accommodate variations in audio recording format and also provide user selectability based on individual preferences. Moreover, it would advantageous if such a system would automatically recognize a preferred equalization requirement and automatically adjust equalization of the audio to provide a proper multichannel audio output for the computer system. Also, such systems should provide an adaptive interface that automatically adapts to a type of media or audio format to better facilitate user control.

BRIEF DESCRIPTION OF THE DRAWINGS

The features of the present invention together with the advantages thereof, may be understood by reference to the following description taken in conjunction with the accompanying drawings wherein:

FIG. 6b is a flow diagram generally depicting a method of operation of a system for automatically controlling multichannel equalization based on the prestored equalization parameters shown in FIG. 6a.

DETAILED DESCRIPTION OF THE INVENTION

The disclosed systems and methods of automatically controlling multichannel audio in a multimedia computer system include three embodiments with varying levels of programmability for automatic multichannel equalization control. In one embodiment, the system uses an adaptive equalization template interface to facilitate input of user presets that are incorporated in stored equalization templates for each audio medium, such as CD's, DVD's, digital audio tapes (DAT's) or other medium. When the audio medium's identification number (ID) is read from the medium header or a particular track, the multichannel audio control system selects the appropriate equalization template preset by the user. The system programs a programmable multichannel audio processor (equalizer) based on the equalization template data to effect desired audio output. In another embodiment of automatic programming and control, the audio storage medium is programmed with equalization "type" data, such as an equalization parameter setting type number in the header or in a track(s) of the audio medium. The equalization "type" number or key is used as an index by the multichannel audio control system to select a user preset equalization template to program the programmable multichannel audio processor using equalization parameters in the template. For example, one of the equalization "type" preset settings may be for classical music, another "type" may be for multichannel movie audio, another type for jazz music or other audio type.

Another embodiment of automatic programming and control by the multichannel audio control system utilizes prestored equalization parameters stored in the header or in a track of the audio medium. The prestored equalization parameters may correspond to an industry standardized equalization settings corresponding to the recorded equalization settings used by the audio medium manufacturer (recorder). As with the other two embodiments, the programmable multichannel audio control system uses the prestored equalization parameters to program the programmable multichannel audio processor to properly control the multichannel audio. However, with this embodiment no prestored multichannel audio control system equalization templates or adaptive interface templates are needed.

Figure 1:
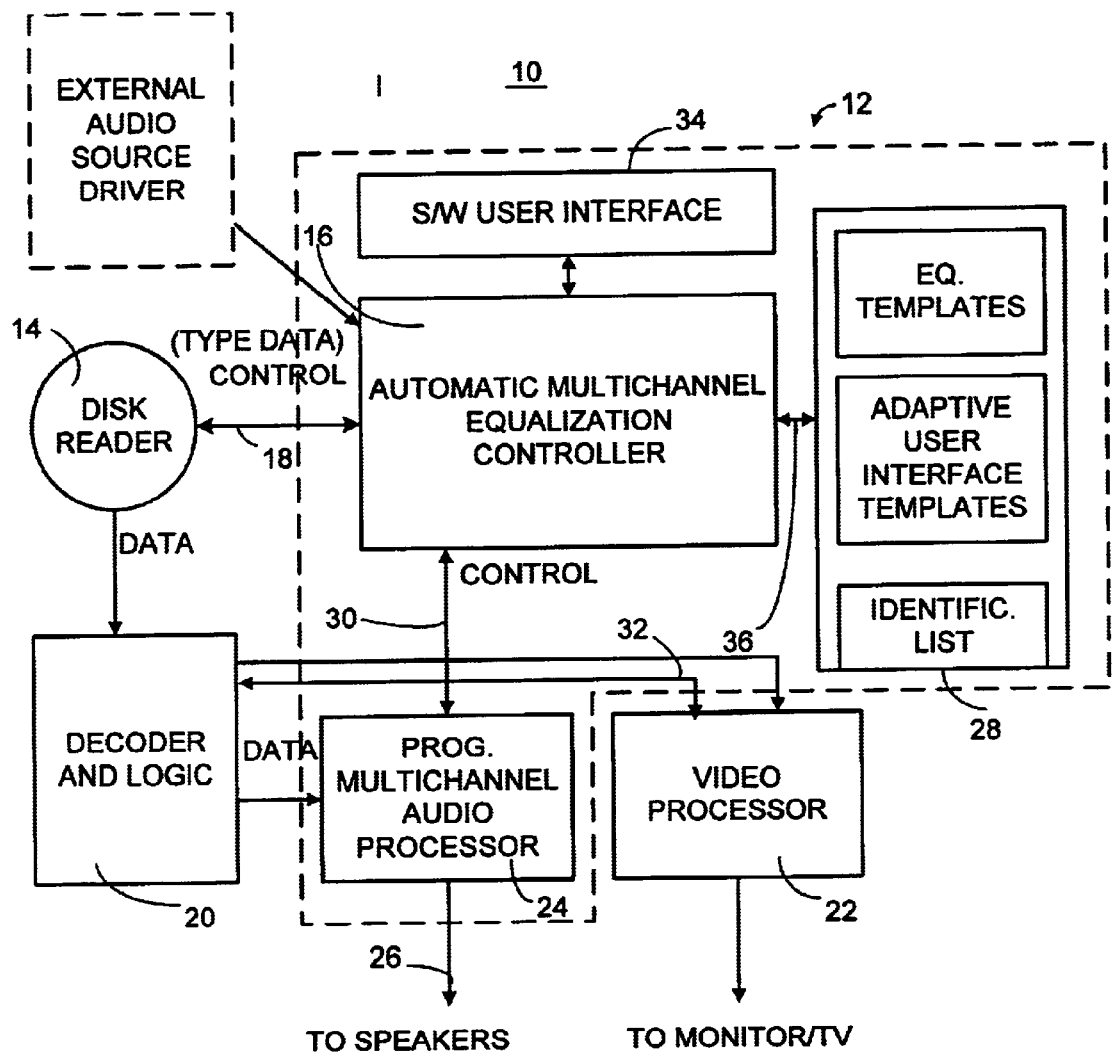
FIG. 1 is a block diagram generally depicting a multimedia computer system having one embodiment of an automatic multichannel audio controller in accordance with the invention.

FIG. 1 shows a preferred embodiment of a multimedia computer system 10 that includes an automatic multichannel audio control system generally indicated at 12. The computer system 10 includes an audio (and video) storage medium reader such as a disc reader 14 for reading and playing a CD, DVD, or other type of media containing multichannel audio. The disc reader 14 is a conventional disc reader that reads header information as preprogrammed on a CD, DVD or other disc. It will be recognized that the disk reader can be any audio medium reader including digital tape readers, TV or audio broadcast signals, streaming video or audio from an Internet connection, or any other suitable external audio source driver (or internal audio source such as a stored audio file).

The automatic multichannel audio control system 12 includes an automatic multichannel equalization controller 16 that communicates with the disc reader 14 through control signal 18. The automatic multichannel equalization controller 16 is preferably a software module stored in associated computer memory executed by a computing unit of the multimedia computer system 10. Control signal 18 contains audio medium identification data such as identification number data that is stored in headers of conventional CD's and DVD's. The computer system 10 also includes a conventional decoder with associated logic 20 that receives audio and video data from disc reader 14 as known in the art. In a case where the disc is a DVD containing video information, the decoder in logic block 20 transmits video data to a standard video processor 22 for output to a monitor or television display as is common in multimedia computer systems. In addition, where the data from disc reader 14 includes audio data, the decoder in logic block 20 transmits the audio data to a programmable multichannel equalization audio processor 24. The programmable multichannel audio processor 24 serves as a programmable multichannel parametric equalizer for each of the multichannels. After processing, multichannel audio output signal 26 is output from the programmable multichannel audio processor 24 to associated speakers.

The automatic multichannel control system 12 also includes memory containing an equalization template block 28 that stores a series of programmable linked multichannel equalization templates or files that are written in an object oriented programming format. However, the templates may be written in any suitable format. As part of the template data, the equalization template block 28 stores multichannel equalizer control values as adjusted (entered) by a user to provide user selectability based on user preferences. The multichannel equalization templates start off as having default values for the equalizer control values. As further described below, the programmable multichannel audio processor 24 selectively controls each channel of multichannel audio based on the equalizer control values from the multichannel equalization templates.

The automatic multichannel equalization controller 16 controls the multichannel audio processor 24 via control line 30 which communicates control signal information based on preset settings in the template block 28. The video processor 22 also communicates control signals to decoder and associated logic 20 through control line 32. The video processor 22 sends synchronization information or channel select information for multiple audio tracks or multiple language tracks through the control line 32.

The computer system 10 also includes a software user interface module 34, which may be a standard user interface to allow a user to enter data in the templates of template block 28 in accordance with the invention. The template block 28 information is accessed by the automatic multichannel equalization controller 16 as indicated by link 36. The automatic multichannel equalization controller 16 displays adaptive interface templates to a user using the user interface module 34, stores equalizer control data entered by the user and adapts interface templates to modify the adaptive interface template to include selected setting entry data for setting desired categories of equalization settings.

Figure 2:
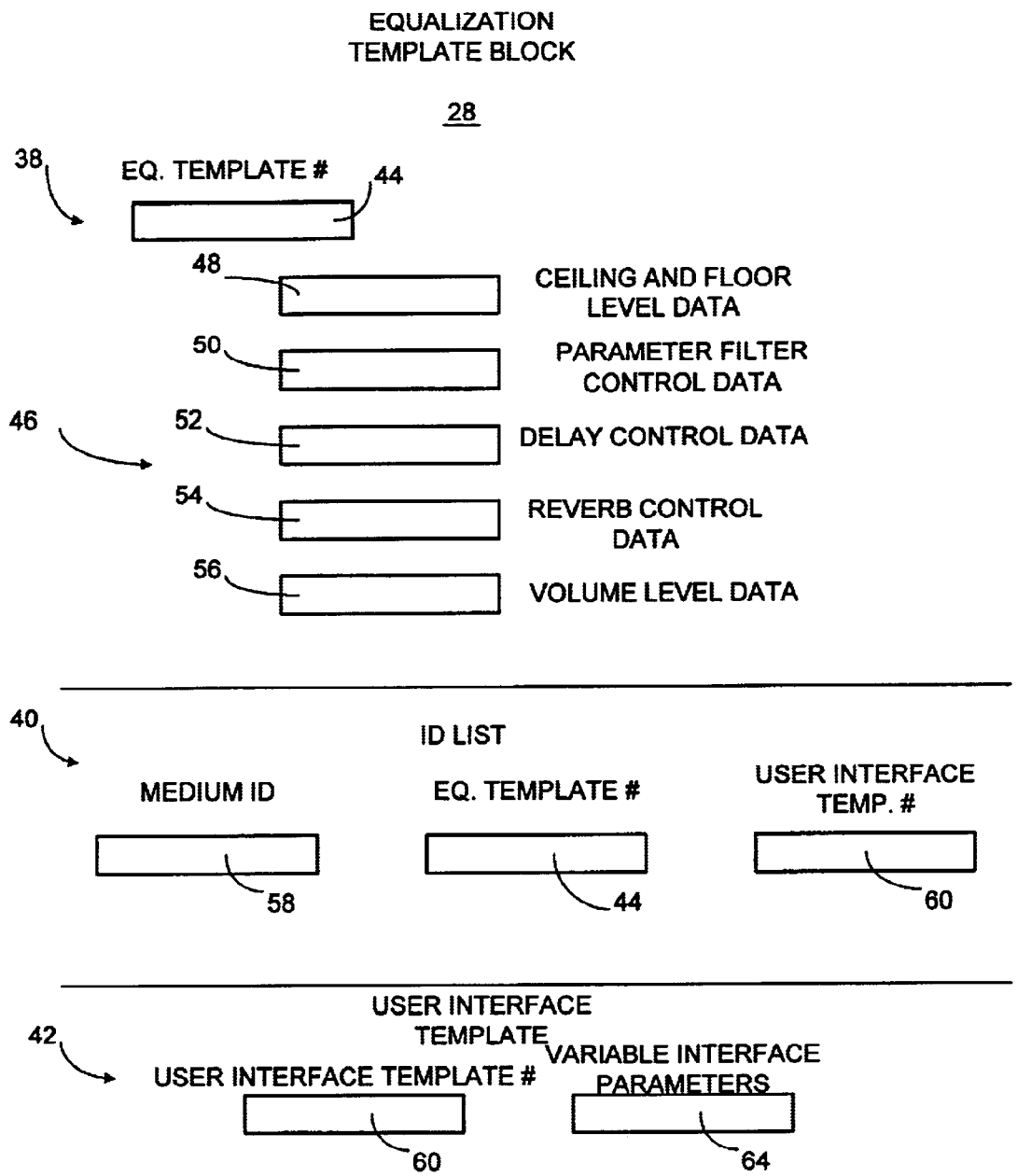
FIG. 2 diagramatically depicts several database templates used by the automatic multichannel audio control system of FIG. 1 in accordance with one embodiment of the invention.

FIG. 2 shows the equalization template block 28 containing an equalization template 38, an identification list template 40, and an adaptive user interface template 42. The equalization template 38 includes equalization template number data 44 (an object) and a plurality of multichannel audio equalizer control values generally indicated as 46. The equalizer control values 46 include ceiling level and floor level data 48, parametric filter control data 50, delay control data 52, reverb control data 54 and volume level control data 56 for each channel and are used by the programmable multichannel audio processor 24 to effect proper equalization of the multichannel audio.

The multichannel audio equalizer control values 46 are preferably programmable and input by a user for each of the multichannels using the adaptive user interface template 42 which may be a Windows based interface. A default equalization template 38 becomes programmed upon storage of the user entered multichannel audio equalizer control values 46. The ceiling level and floor level data 48 are used in a compression stage as compression level thresholds. The parameter filter control data represents equalizer frequency band range settings so that the user can fashion a customized equalizer for each of the multichannels. For example, of a 0 Hz to 20 KHz audio frequency range, the user may divide the range into linear or logarithmically even bands of frequency ranges and set a different level for each separate band in response to the interface template 42.

The delay control data 52 stored in the equalization template 38 is programmable and set by a user to a desired delay level to imply that the surround speakers are further apart or closer together for a given disc or track. Similarly, the reverb control data 54 stored in the equalization template 38 is programmable and set by the user to a desired reverb level to imply that the room is larger or smaller in size for a given disc or track. The volume level data 56 entered by the user sets the volume level of each of the multichannels.

The identification (ID) list template 40 includes audio medium identification data 58 which is typically a stored number in a header of a disc. The identification (ID) list template 40 also includes user interface template number data 60 and the equalization template number data 44. The ID list template 40 is thereby linked to the equalization template 38 and the user interface template 42. The ID list template 40 links a particular disc to a particular equalizer template and user interface template so that each time the disc is played, the system 10 automatically presents the proper interface template if a change is desired and automatically programs the programmable multichannel audio processor 24 with stored equalizer control values 46.

The adaptive user interface template 42 includes interface template number data 60 and a set of variable interface parameters 64. The set of variable interface parameters 64 are selected by the automatic multichannel equalization controller 16 based on the audio medium header data such as the format of the multichannel audio as later described. The user interface template number 60 is used to select a specific user interface template 42 to display on the monitor. The user can then adjust the variable interface parameters 64 through the user interface template 42. The programmable multichannel equalization template 28 contains parameter values 46 that are adjustable to a desired setting by a system user through interface template 42 when variable interface parameters 64 are changed.

Preferably the user interface template 42 may only allow access to a subset of all parameters 46, so only the parameters 46 which are deemed relevant to the user are stored as parameters 64 and can be modified. The multichannel equalization controller 16 obtains equalizer control values 46 from a selected multichannel equalization template and communicates the obtained equalizer control values 46 to the programmable multichannel audio processor 24 for use in selectively controlling each channel of multichannel audio.

Figure 3:
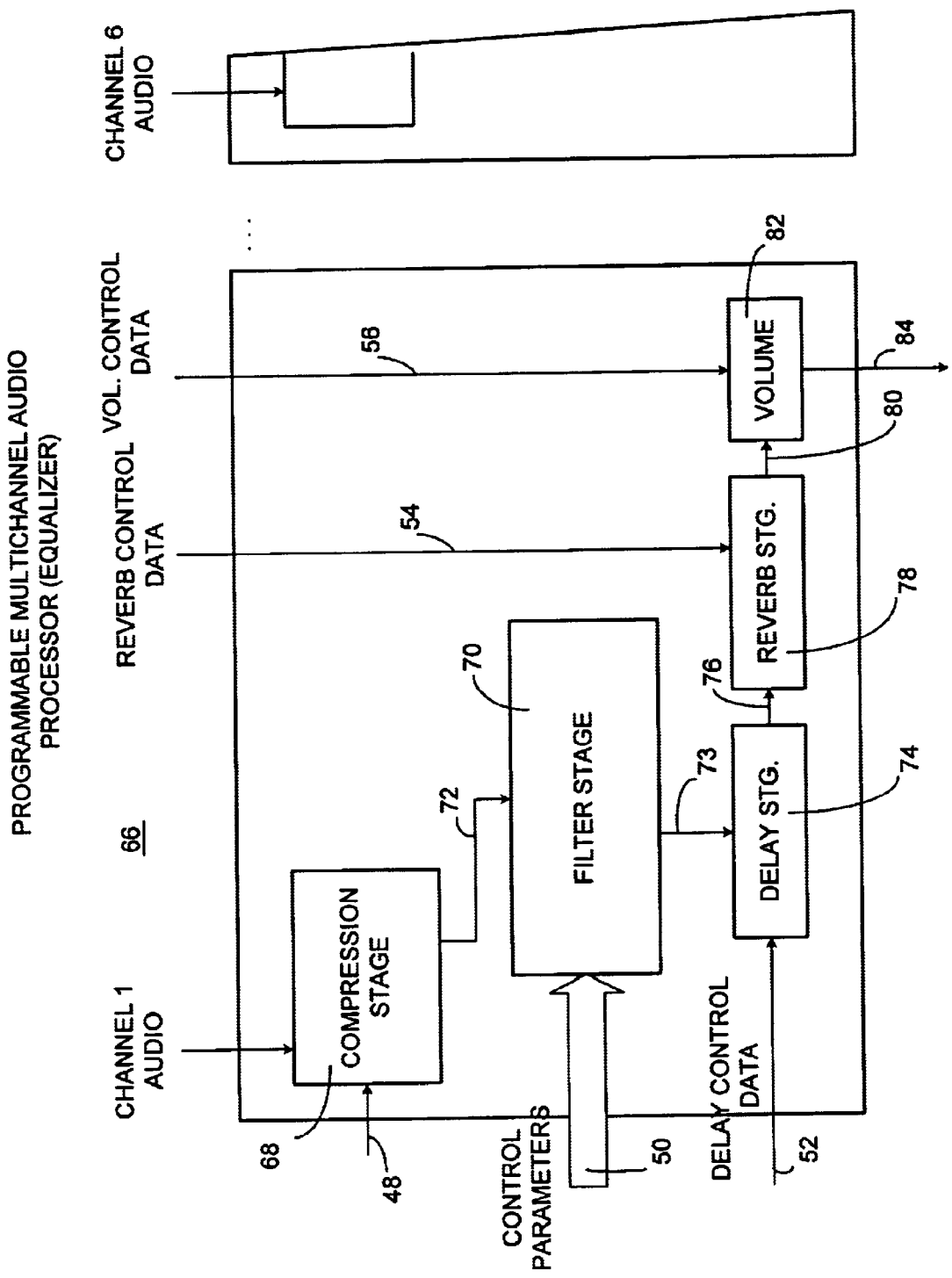
FIG. 3 is a block diagram generally depicting one embodiment of a programmable equalization block for a single channel of the multichannel audio control system in accordance with one embodiment of the invention.

FIG. 3 depicts one equalization block for one channel of the programmable multichannel audio processor 24. The equalization block 66 for audio multichannel 1 includes a compression block 68 for receiving the ceiling level and floor level data 48. The compression block adaptively reduces the dynamic range of selected portions of the audio signal as known in the signal compression art. The volume of soft audio passages is increased and the volume of loud audio passages is decreased. The floor and ceiling thresholds define the volume level thresholds where the increasing or decreasing begins. To avoid unnecessary distortion, the thresholds (which may be settings in dB) are compared against the average energy of a number of samples, not on a sample by sample basis. If the average energy is greater than the ceiling threshold, the output data 72 is decreased in volume in a non-linear manner. If the average energy is less than the floor threshold, the output data 72 is increased in volume in a non-linear fashion. Furthermore, if the audio signal is already compressed to reduce noise, the compression stage 68 reverses the compression process to produce an original uncompressed audio signal, provided the original compression parameters are available.

Equalization block 66 includes parametric filter block 70 for selectively equalizing each of a plurality of frequency bands by a different control factor. Parametric filter block 70 receives output data 72 as a stream of digital samples from the compression stage 68. Parametric filter block 70 receives parametric equalization control data 50 which is preferably 8 to 64 dB values indicating attenuation levels for each frequency band. Parametric filter block 70 may be a conventional type parametric filter block having a parallel bank of filters that isolate different frequency bands, and where each frequency band can be individually attenuated. Each parametric filter block 70 has a set of programmable audio filters that is responsive to the filter parameter control data, to equalize each audio channel in accordance with the equalizer control values from the equalizer template. Parametric filter block 70 outputs filtered audio signals 73 to a delay control stage 74. The delay control stage 74 receives delay control data 52 for setting delay and feedback parameters to effect a delayed audio signal. The delay control stage receives filtered audio 73 as output from the set of filters in filter stage 70. The delay control stage 74 controls the amount of delay in the filtered audio signal 73 and generates a delay enhanced audio signal 76. The output delay enhanced audio signal 76 from the delay stage 74 is transmitted to a reverb control stage 78 which receives the reverb control data 54. The reverb control stage 78 receives the delay enhanced audio signal 76 and generates a reverb enhanced audio signal 80. The reverb control stage 78 mixes delayed and filtered versions of the input signal with itself, to simulate an echo off of a surface, such as a wall in a room. The amount of delay represents the time required for the sound to travel to the wall and back, and the low. A low-pass filter stage is used to represent the high frequency absorption of natural surfaces. A volume control stage 82 receives the volume level control data 56 and the reverb enhanced audio signal 80 to control a volume level of the reverb enhanced signal 80. Volume level adjustment is done by multiplying each sample in the audio stream by a gain factor.

It will be recognized by those of ordinary skill in the art, that the delay and reverb volume blocks may be ordered in a different manner to effect differing audio control. An equalization block 66 is repeated for each of the multichannels resulting in six equalization blocks where the system 12 facilitates control of surround sound. Any suitable number of equalization blocks 66 may be used. Also, the programmable stages of the programmable multichannel audio processor 24 may be programmed with data to effect no reverb, delay or other parameter.

Figure 4A:
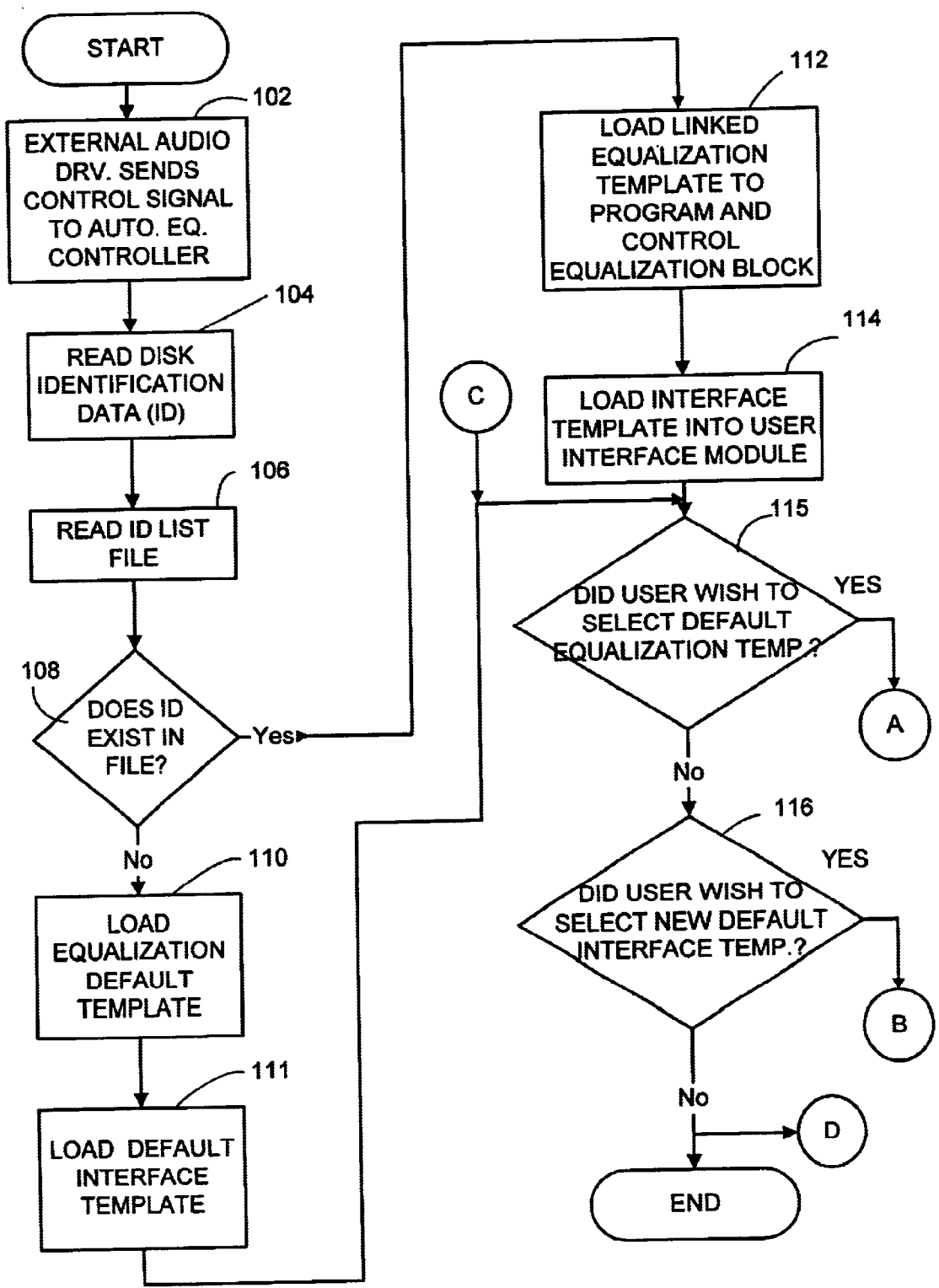
FIG. 4a and FIG. 4b is a flow chart generally depicting a method of operation in accordance with one embodiment of the invention used by the automatic multichannel audio control system of FIG. 1.

FIG. 4a is a flow diagram generally depicting the operation of the automatic multichannel equalization control system 12. As with conventional disc reader systems, inserting a disc into the disc reader activates the disc reader control software. If audio is present on the disc, the disc reader control software connects the disc reading system to the audio subsystem. Similarly, a software application may connect external media or external audio source driver, such as a broadcast signal or a streaming audio signal from the Internet, to the audio subsystem. The associated software application activates the automatic multichannel equalizer controller 16 via control line 18. This is shown in block 102. The automatic multichannel equalization controller 16 then reads the disc ID data from the disc reader 14 as indicated in block 104. Next, the automatic multichannel equalization controller 16 accesses template block 28 to read the ID list template 40 to match the read ID data received from the disc reader 14 with stored ID number data 58. This is shown in block 106.

As shown in block 108, the automatic multichannel equalization controller 16 determines whether the read ID number exists in the ID list 40. If the read ID number does not exist, the automatic multichannel equalization controller 16 loads a default equalization template and communicates the default equalizer control data to the programmable audio processor 24 to process the multichannel audio signals as shown in block 110. Then an appropriate default interface template is loaded into the user interface module 34. The appropriate interface is determined by the set of parameters used in the equalization template. This is shown in block 111. If the read disc ID exists in the ID list template 40, indicating that the disc has already been used and equalizer control data has been entered by the user for that disc, the automatic multichannel equalization controller 16 loads the equalization settings from the corresponding equalization template 44 associated with the ID data 58 and controls the programmable audio processor 24 accordingly as indicated in block 112. In this way, the multichannel equalization controller 16 selects one of the multichannel equalization templates in response to the media identifier data (read ID data).

The automatic multichannel equalization controller 16 then loads adaptive user interface template 42 based on the ID number 58 from ID list template 40 as shown in block 114. Based on the adaptive user interface template 42, a user may modify the equalization template data 38. Since the adaptive user interface 42 only has certain of the variable interface parameters 64, only certain parameters are accessible by the user. For example, if the disc is an audio CD, recorded in two channel stereo, the user will not be allowed to modify all six multichannels but instead will only be allowed to modify two stereo channels. The user may request to select a new equalization template, as shown in block 115, or select a new interface template as shown in block 116.

Figure 4B:
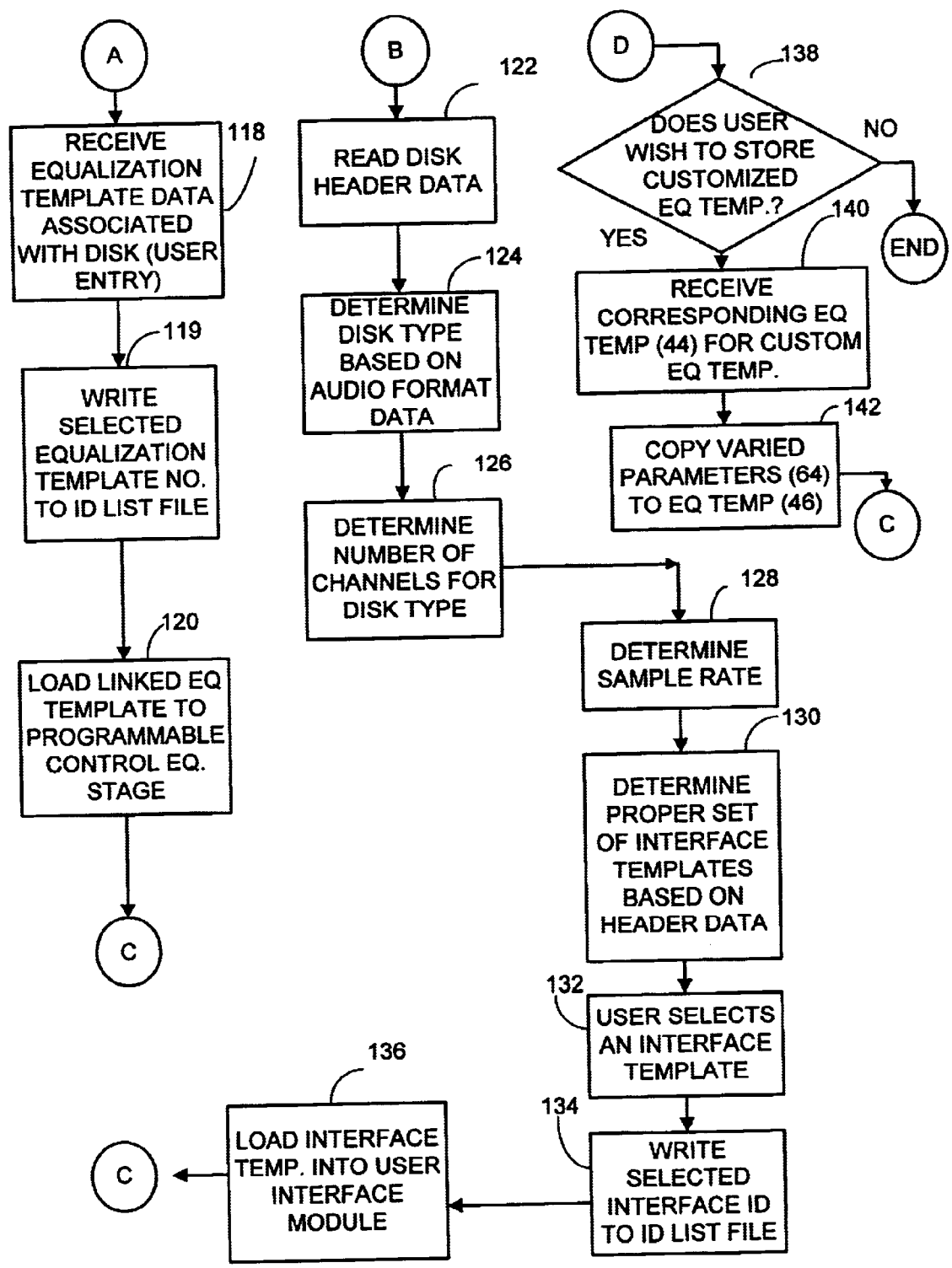

As shown in FIG. 4b, if the user wishes to select an equalization template (block 115 of FIG. 4a), the system 12 then displays EQ template options for selection by the user as shown in block 118. For example, the system 12 displays data representing icons or menu selections indicating the types of EQ templates available such as an EQ template for classical music, for rock music, for jazz music, for movies or other categories.

Once the equalization template is selected by the user, the system 12 writes the selected equalization template number 44 to the ID list 40 as indicated in block 119. As a result, the system 12 links the disc identifier data 58 to a particular equalization template 44 so that upon use of the same disc, the system 12 automatically sets the multichannel audio control system to the suitable programmable equalization levels. As such, the template storage memory stores equalization template identification data 40, such as data 58, linked to a programmable multichannel equalization template 38 to facilitate selection of the programmable multichannel equalization template 38 by multichannel equalization controller 16. The system 12 loads the equalization template 28, hence parameter data 46, into a buffer or memory location accessed by the automatic multichannel equalization controller 16 for customization or storage for later use by the user. This is shown in block 120.

If the user wishes to select a new default interface template, the system makes a set of appropriate interfaces available. The system 12 selects adaptive equalization interface templates to display to the user based on audio media header data including the disc ID information and other header information. In this way, a user is only presented with the task of selecting and inputting necessary multichannel audio information for a particular type of disc and audio format. The system 12 evaluates the audio media header to determine desired categories of equalization settings and modifies the adaptive equalization interface template to include selected setting entry data for setting the desired categories of equalization settings.

The adaptive creation is carried out by the system 12 reading the disc header for additional prestored information as shown in block 122. This information includes standard DVD header information such as whether the DVD contains video and audio or only video or only audio, header data indicating the number of audio channels and header data indicating the format in which the audio is recorded. As indicated in block 124, the system 12 evaluates the header data indicating the type of format the audio is recorded in to determine whether the audio is in two channel stereo, in AC-3 format, MPEG-2 format, HDCD (high definition compact disc) format, or other format.

As shown in block 126, for each disc type or audio format, the system 12 determines the number of audio channels used by the disc. In addition, the system 12 determines from the header information the audio sample rate used as the output signal sample rate as indicated in block 128. This information is used to determine whether or not sample rate conversion must take place. Based on the audio media header data, the system 12 determines the proper variable interface parameters 64 for the interface template 42 for the selected EQ template as shown in block 130. For example if the system 12 determines that the disc type has fewer than six multichannels, the interface template will only provide the user with variable interface parameters relating to the actual number of channels used by the particular disc. If the audio media is recorded in karaoke format versus multichannel format, a different equalization interface template is necessary, because a karaoke guide vocal channel is treated as an optional channel since it can be removed, whereas a multichannel vocal channel for standard surround channel recordings should always be present. Furthermore, a karaoke guide vocal channel can be labeled as such, to reduce confusion to the user. Consequently the interface templates for facilitating the input of equalization parameter data 46 are adaptively adjusted by the system 12 depending upon the type of audio media type (disc) and audio format being used, by the user to minimize the user data entry selections.

Once the interface template is selected by the user in block 132, the system 12 writes the selected interface template ID number 60 to the ID list 40 as indicated in block 134. As a result, the system 12 links the disc identifier 58 to a particular user interface template 60 so that upon use of the same disc, the system 12 automatically sets the multichannel audio control system to the suitable programmable equalization levels and interface displays for the user. As shown in block 136, the system 12 loads the equalization template 28 into a buffer or memory location accessed by the automatic multichannel equalization controller 16 for customization or storage for later use by the user.

The user may also link an equalization template and associated interface template with a given disc by entering identification data 58 with an equalization template. Also, the user may link identification data 58 with one or more discs so that mulitple discs have the same equalization parameters.

If desired, a user may customize equalization templates through the interface template. As shown in block 138, the interface template has a button or menu allowing the user to customize equalization parameters 46. If the button is activated, the system 12 receives the corresponding equalization template number data 44 as entered by the user. This is shown in block 140. Once the user adjusts the parameters 64 through the graphic interface template, the system 12 copies the varied parameters 64 to an equalization template and stores the varied parameters as parameters 46 for the customized template.

Based in the above operation, the system 12 stores a plurality of multichannel equalization templates 38 containing equalizer control values 46 in template block 28 stored in memory. The multichannel equalization controller 16 obtains the equalizer control values 46 from a selected multichannel equalization template and communicates the equalizer control values to the programmable multichannel audio processor 24 through control signals 30. The programmable multichannel audio processor 24 selectively controls each channel of multichannel audio through the equalization block 66 based on the equalizer control values 46 from the selected multichannel equalization template.

In addition, the system 12 provides a plurality of adaptive equalization user interface templates 42 to facilitate entry of the equalizer control parameters 46. The multichannel equalization controller 16 evaluates audio media header data including channel number data and audio format data to determine desired categories of equalization settings. The multichannel equalization controller 16 modifies (e.g., populates a GUI field to display selected setting entry data or associates selected setting entry data with desired information) at least one adaptive equalization user interface template 42 to include selected setting entry data for setting the desired categories of equalization settings by varying the variable interface parameters 64.

To control the multichannel audio of each channel, the programmable multichannel audio processor 24 filters a received audio signal for each channel using filter parameter control data from the equalizer control data and controls the amount of delay in the filtered audio based on delay control data from the equalizer control data and generates a delay enhanced audio signal. The programmable multichannel audio processor 24 also controls the amount of reverberation in the delay enhanced audio signal based on reverb control data from the equalizer control data and generates a reverb enhanced audio signal. Also, the programmable multichannel audio processor 24 controls a volume level of the reverb enhanced signal based on the volume level control data from the equalizer control data.

Figure 5A:
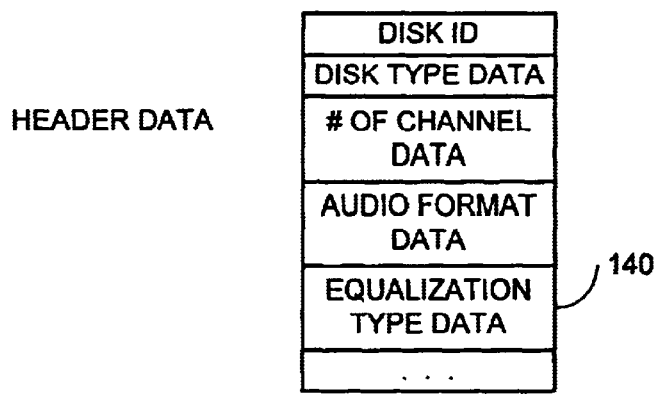
FIG. 5a in accordance with another embodiment of the invention to facilitate automatic multichannel audio control equalization.

FIG. 5a shows an alternative embodiment of stored data wherein the disc header contains prestored equalization "type" information. The equalization type data 140 is stored as additional data in the disc header or on a per track basis if desired so that each track may have a different equalization setting. Preferably, the equalization type data 140 indicates whether the audio content is jazz, classical, rock, movie, or other desired category.

The automatic multichannel equalization controller 16 requests header data from the audio storage medium reader to obtain the prestored equalization type data 140 stored on the audio storage medium. The prestored equalization type data 140 is used as index data by the automatic multichannel equalization controller 16 to retrieve corresponding equalization template data 38 containing preset equalizer control values, for each channel, for automatically equalizing each channel in accordance with the preset equalizer control values.

Figure 5B:
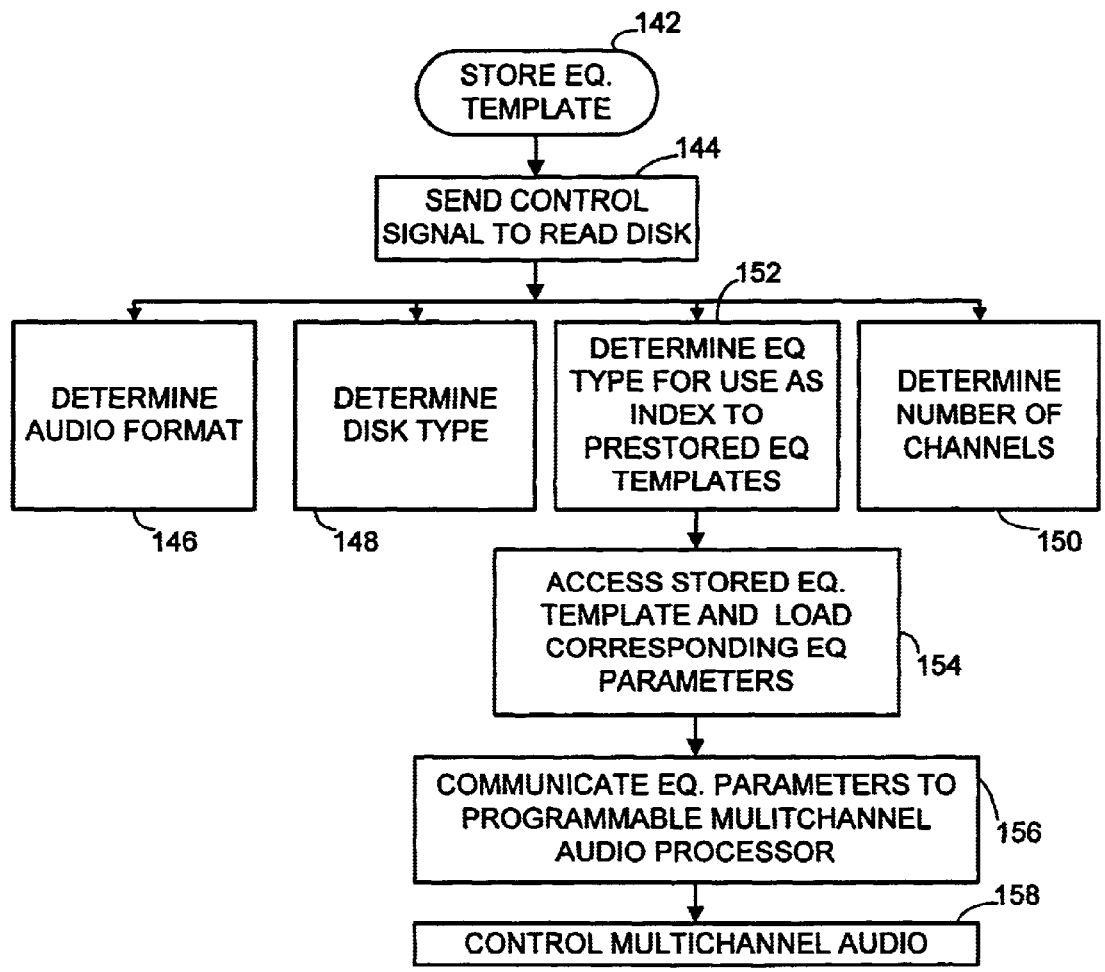
FIG. 5b is a flow diagram generally depicting a method of operation for another embodiment of an automatic multichannel control system in accordance with the invention.

FIG. 5b shows the method of operation of a system using the prestored equalization type data 140 stored in a disc header or track. As with the automatic multichannel control system 12, the equalization type 140 driven system stores the same equalization templates 38 as shown in block 142. The system accesses the disc reader to obtain the disc header information including the equalization type data 140 as shown in block 144. Similar to the system of FIGS. 4a and 4b, the system analyzes the disc header information including audio format data as indicated in block 146, disc type data 148 and the number of audio channels as shown in block 150. The system also receives the equalization type data 140 and uses the information as an index to look up the corresponding prestored equalization template as shown in block 152.

Each equalization type 140 corresponds to a different equalization template 38 similar to the equalization type information entered by the user as stated earlier. The primary difference is that instead of a user entering the type data, equalization types are prestored on the discs by the disc manufacturer indicating the predefined equalization type.

Using the equalization type data 140, the system accesses the stored equalization template and loads the corresponding equalization parameters 46 from the proper equalization template. This is shown in block 154. The system communicates the equalization parameters from the indexed equalization template and communicates the equalization parameters 46 to the multichannel audio processor as shown in block 156. Next in a similar way as previously described, the system then controls the multichannel audio in accordance with the equalization parameters 46 as indicated in block 158. Hence, the system obtains prestored equalization type data 140 stored on an audio storage medium for use as index data and retrieves corresponding equalization template data containing preset equalization control values to automatically equalize each channel in accordance with the preset equalizer control values.

Figure 6A:
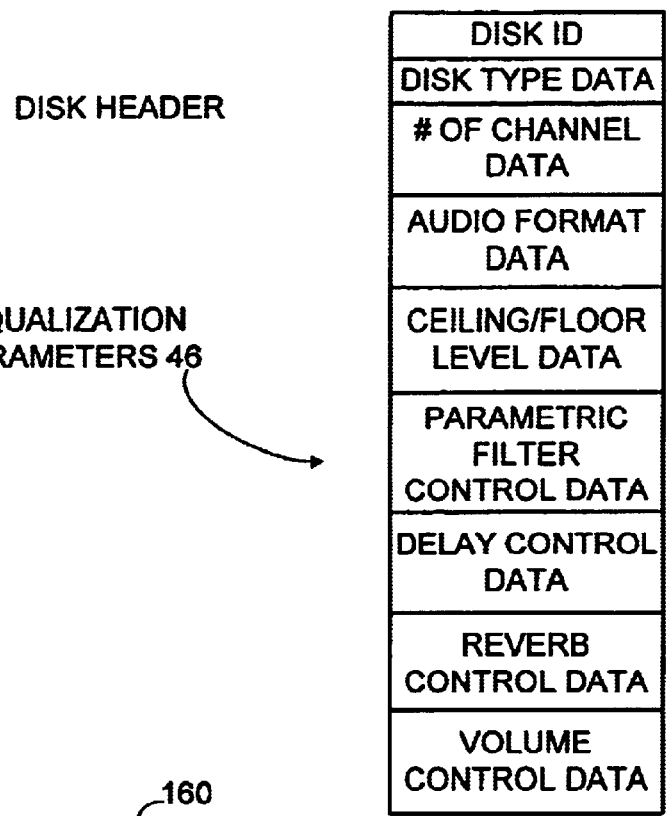
FIG. 6a is a block diagram depicting prestored equalization parameters in a disc header in accordance with another embodiment of the invention to facilitate automatic multichannel audio equalization control.
Figure 6B:
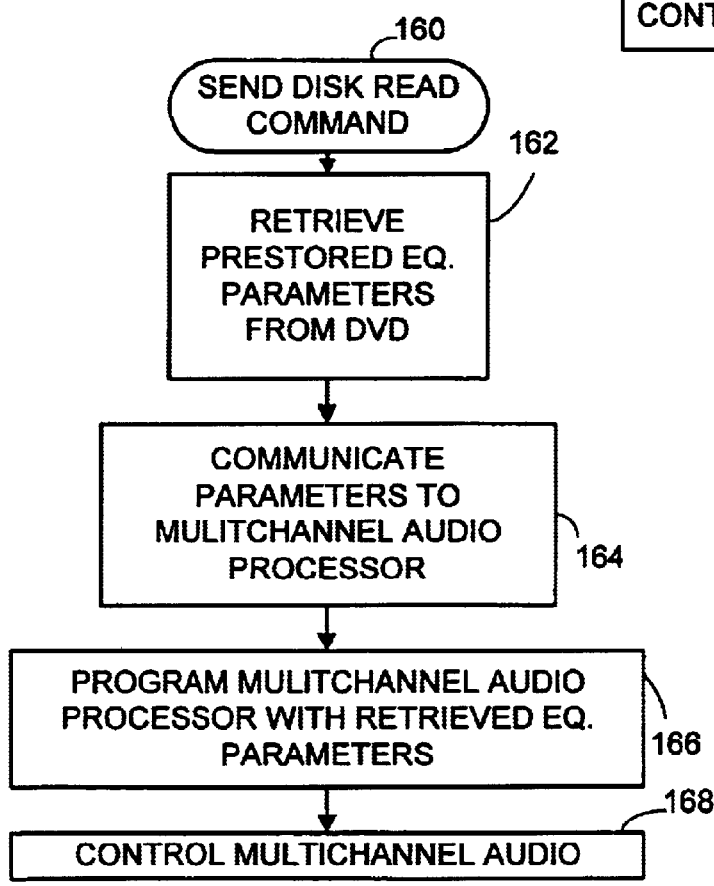

As yet another alternative embodiment, the equalization templates 38 may be eliminated as separate files in the automatic multichannel control system where the equalization parameter data 46 is stored on the disc itself. As shown by way of example in FIG. 6a, a DVD header for the disc or information for each track, may include the prestored equalization parameters 46 for the entire disc. In this way, the equalization parameters 46 are obtained from the medium itself as opposed to the system having memory dedicated to storing equalization template data. This can substantially reduce the memory requirements of the system. Therefore, FIG. 6a shows that the delay data 52 parameter filter control data 50, ceiling level and floor level data 48, reverb control data 54 and volume level control data 56, may be stored as bits in the disc header or other suitable location on the disc.

In operation, such a system accesses the disc reader as shown in block 160. The automatic multichannel control system then retrieves the prestored equalization parameters 46 directly from the DVD or disc as shown in block 162. The system then communicates the retrieved prestored equalization parameters 46 to the multichannel audio processor 24 as indicated in block 164. As with the other embodiments described herein, the system then programs the multichannel audio processor 24 with the retrieved parameters 46 as indicated in block 166. The multichannel audio processor 24 under control of the automatic multichannel equalization controller 16 then selectively controls each channel of the multichannel audio as indicated in block 168. Since the equalization parameters are stored on the disc itself, the equalization template block 28 is not necessary in the embodiment disclosed.

It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. An automatic multichannel equalization control system for a computer system comprising:

memory that contains a plurality of multichannel equalization templates containing equalizer control values;

programmable multichannel audio processor, directly responsive to the equalizer control values, and operative to selectively control each channel of multichannel audio based on the equalizer control values from the multichannel equalization templates, wherein the multichannel equalization templates are programmable through a user interface to directly accommodate changes in equalizer control values; and multichannel equalization controller operative to obtain equalizer control values from a selected multichannel equalization template and to communicate the obtained equalizer control values to the programmable multichannel audio processor, for direct use in selectively controlling each channel of multichannel audio, wherein the memory stores at least one programmable multichannel equalization template operatively linked to indentification list template data to facilitate selection of the programmable multichannel equalization template by the multichannel equlization controller.

2. The control system of claim 1 wherein the equalizer control values include filter parameter control data and the audio processor further includes a set of programmable audio filters for each channel of multichannel audio that is responsive to the filter parameter control data, to equalize each audio channel in accordance with the equalizer control values from the memory.

3. The control system of claim 1 further including a media reader, in operative communication with the multichannel equalization control, for reading media identifier data that uniquely indentifies media for use by the multichannel equalization controller to select at least one of the multichannel equalization templates in response to the media identifier data.

4. The control system of claim 1 wherein the memory further stores adaptive user interface template data operatively linked to the identification list template data.

5. The control system of claim 4 wherein the adaptive user interface template data is adaptive to a type of audio media and audio format being used.

6. The control system of claim 1 wherein the programmable multichannel equalization template contains parameter values that are adjustable to a desired setting by a system user.

7. The control system of claim 1, the multichannel equalization controller, in operative communication with an audio storage medium reader, prestored equalization type data stored on the audio storage medium for use as index data to retrieve corresponding equalization template data containing preset equalization control values for automatically equalizing each channel in accordance with the preset equalizer control values.

8. The system of claim 1 wherein the memory also contains at least one adaptive interface template and wherein the multichannel equalization controller obtains and evaluates audio media header data including channel number data and audio format data, to determine desired categories of equalization settings and modifies the adaptive interface template to include selected setting entry data for setting the desired categories of equalization settings.

9. The control system of claim 2 wherein the equalizer control values include equalization delay control data, reverb control data and volume level control data and the multichannel audio processor further includes for each channel, a delay control stage, operatively coupled to receive filtered audio as output from the set of filters and to receive the equalization delay control data, for directly controlling an amount of delay in the filtered audio and generating a delay enhanced audio signal;

a reverb control stage, operatively coupled to receive the reverb control data and operatively coupled to receive the delay enhanced audio signal, for directly controlling an amount of reverberation in the delay enhanced audio signal and generating a reverb enhanced audio signal; and volume control stage, operatively coupled to receive the volume level control data and the reverb enhanced audio signal, for directly controlling a volume level of the reverb enhanced signal.

10. An automatic multichannel equalization control system for a computer system comprising:

memory that contains a plurality of multichannel equalization templates containing programmable equalizer control values and for storing adaptive user interface template data;

multichannel equalization controller that obtains the programmable equalizer control values from a selected multichannel equalization template and for obtaining and evaluating audio media header data including channel number data and audio format data, to determine desired categories of equalization settings such that the adaptive interface template is modified to include selected setting entry data for setting the desired categories of equalization settings; and multichannel audio processor, directly responsive to the multichannel equalization controller, operative to selectively control each channel of multichannel audio based directly on the programmable equalizer control values, wherein the memory contains at least one programmable multichannel equalization template operatively linked to identification list template data to facilitate selection of the programmable multichannel equalization template by the multichannel equalization controller.

11. The control system of claim 10 wherein the programmable equalizer control values include equalization ceiling level data, parameter equalization control data, delay control data, reverb control data and volume level control data.

12. The control system of claim 11 wherein the equalizer control values include equalization delay control data, reverb control data and volume level control data and the multichannel audio processor further includes for each channel, a delay control stage, operatively coupled to receive filtered audio as output from the set of filters and to receive the equalization delay control data, for directly controlling an amount of delay in the filtered audio and generating a delay enhanced audio signal;

a reverb control stage, operatively coupled to receive the reverb control data and operatively coupled to receive the delay enhanced audio signal, for directly controlling an amount of reverberation in the delay enhanced audio signal and generating a reverb enhanced audio signal; and volume control stage, operatively coupled to receive the volume level control data and the reverb enhanced audio signal, for directly controlling a volume level of the reverb enhanced signal.

13. A method of controlling multichannel audio in a computer system comprising:

storing a plurality of multichannel equalization templates containing equalizer control values;

obtaining the equalizer control values form a selected multichannel equalization template;

selectively controlling each channel of multichannel audio based directly on the equalizer control values from the multichannel equalization templates;

providing a plurality of adaptive equalization user interface templates to facilitate entry of the equalizer control parameters;

evaluating audio media header data including channel number data and audio format data to determine desired categories of equalization settings;

modifying at least one adaptive equalization user interface template to include selected setting entry data for setting the desired categories of equalization settings; and storing identification list template data operatively linked to the equalization templates and adaptive user interface template data to facilitate selection of equalization control values based on audio medium identification data.

14. The method of claim 13 further including the steps of:

obtaining prestored equalization type data stored on an audio storage medium for use as index data;

retrieving corresponding equalization template data containing preset equalization control values for automatically equalizing each channel in accordance with the preset equalizer control values.

15. The method of claim 13 wherein the step of controlling includes the steps of:

filtering a received audio signal for each channel using filter parameter control data directly from the equalizer control data;

controlling an amount of delay in the filtered audio based on delay control data directly from the equalizer control data and generating a delay enhanced audio signal;

controlling an amount of reverberation in the delay enhanced audio signal based on reverb control data directly from the equalizer control data and generating a reverb enhanced audio signal; and controlling a volume level of the reverb enhanced signal based directly on the volume level control data from the equalizer control data.

16. An automatic multichannel equalization control system for a computer system comprising:

audio storage medium having non-indexed multichannel equalizer control values stored thereon;

multichannel equalization controller, in operative communication with at least one media reader that reads the audio storage medium, operative to obtain the multichannel equalizer control values stored on the audio storage medium; and multichannel audio processor, responsive to the multichannel equalizer control data operatively received from the multichannel equalization control system, operative to selectively control each channel of multichannel audio based on the equalizer control values.

17. The control system of claim 16 wherein the equalizer control values include at least equalization delay control data, reverb control data and volume level control data and the multichannel audio processor further includes for each channel, a delay control stage operatively coupled to receive filtered audio as output from the set of filters and to receive the equalization delay control data, for controlling an amount of delay in the filtered audio and generating a delay enhanced audio signal;

a reverb control stage, operatively coupled to receive the reverb control data and operatively coupled to receive the delay enhanced audio signal, for controlling an amount of reverberation in the delay enhanced audio signal and generating a reverb enhanced audio signal; and volume control stage, operatively coupled to receive the volume level control data and the reverb enhanced audio signal, for controlling a volume level of the reverb enhanced signal.

\* \* \* \* \*